(12) United States Patent
Tsuyuno et al.

(10) Patent No.: US 9,373,558 B2
(45) Date of Patent: Jun. 21, 2016

(54) RESIN-SEALED ELECTRONIC CONTROL DEVICE

(71) Applicant: HITACHI, LTD., Tokyo (JP)

(72) Inventors: Nobutake Tsuyuno, Tokyo (JP); Hiroshi Hozoji, Tokyo (JP); Takashi Naito, Tokyo (JP); Motomune Kodama, Tokyo (JP); Masanori Miyagi, Tokyo (JP); Takuya Aoyagi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/769,231

(22) PCT Filed: Feb. 22, 2013

(86) PCT No.: PCT/JP2013/054431
§ 371 (c)(1),
(2) Date: Aug. 20, 2015

(87) PCT Pub. No.: WO2014/128899
PCT Pub. Date: Aug. 28, 2014

(65) Prior Publication Data
US 2016/0005671 A1    Jan. 7, 2016

(51) Int. Cl.
*H01L 23/29* (2006.01)
*H01L 25/07* (2006.01)
*H01L 25/16* (2006.01)
*H01L 23/31* (2006.01)

(52) U.S. Cl.
CPC .......... *H01L 23/291* (2013.01); *H01L 23/3107* (2013.01); *H01L 25/072* (2013.01); *H01L 25/16* (2013.01)

(58) Field of Classification Search
CPC ............... H01L 2224/34; H01L 29/66295; H01L 2924/0696
See application file for complete search history.

(56) References Cited

U.S. PATENT DOCUMENTS

2014/0145122 A1    5/2014   Sawai et al.

FOREIGN PATENT DOCUMENTS

| JP | 59-155151 A | 9/1984 |
|---|---|---|
| JP | 63-003442 A | 1/1988 |
| JP | 63-3442 A | 1/1988 |
| JP | 05-183071 A | 7/1993 |
| JP | 5-183072 A | 7/1993 |
| JP | 05-183072 A | 7/1993 |
| JP | 05-186241 A | 7/1993 |
| JP | 2013-032255 A | 2/2013 |

*Primary Examiner* — Elias M Ullah
(74) *Attorney, Agent, or Firm* — Volpe and Koenig, P.C.

(57) ABSTRACT

The present invention is intended to increase the moisture resistance of a resin-sealed electronic control device. The resin-sealed electronic control device includes: a semiconductor chip; a chip capacitor; a chip resistor; a bonding member; a substrate; a case; a heat radiating plate; a glass coating; and a first sealing material. The glass coating directly covers the electronic circuit formed by the element group including: the semiconductor chip; the chip capacitor; and the chip resistor, the bonding member and the substrate, and is sealed by the first sealing material. By being water impermeable, the glass coating prevents water absorption in the vicinity of the element group, and can prevent an increase in the leak current of the semiconductor chip due to water absorption, and an insulation performance drop such as lowered insulation resistance caused by migration within the element group.

20 Claims, 12 Drawing Sheets

RESIN-SEALED ELECTRONIC CONTROL DEVICE

TECHNICAL FIELD OF THE INVENTION

The present invention relates to a substrate with electronic elements such as semiconductor chips and chip components mounted thereon, and to a resin-sealed electronic control device obtained by sealing such a substrate with a resin.

DESCRIPTION OF BACKGROUND ART

In recent years, offshore wind power system has attracted interest as an effectively way of using natural energy for the prevention of global warming. Wind power generation requires a power converter for converting the wind turbine rotation into power, and a control unit for controlling the power conversion. The power converter usually utilizes switching of high efficiency power semiconductors, and the semiconductor elements are insulated and protected by being sealed with a gel or a resin.

The offshore atmosphere is more humid and saline than the onshore environment, and therefore there is a need to be more moisture-resistant power converters and control units in order to use in the offshore wind power systems.

Another area of interest for the prevention of global warming is automobiles, where low fuel consumption cares are required. In these years, motor-driven electric cars and motor-engine hybrid cars have been getting a lot of attention. The high power onboard motors for driving automobiles are difficult to be driven and controlled with the DC voltage of the onboard battery, and requires a power converter that utilizes switching of power semiconductors for the AC control of the boosted voltage. A power converter that uses switching of high efficiency power semiconductors has become mainstream, and semiconductor elements in such power converters are sealed with a resin for insulation and protection, and, at the same time, miniaturization.

Power semiconductor elements generate heat due to conducting electricity. Cooling structures play an important role in this type of semiconductor elements, and water cooling has become a mainstream method of the cooling. Then, such a power semiconductor element is required to have a water-proofing structure.

A mold-sealed semiconductor device of a structure with excellent moisture resistance is known in which semiconductor elements are mounted on a lead frame, and in which a room-temperature glass coating (heat-less glass coating) is used to mold and seal the semiconductor elements, the bonding wires and the bonding area after wire bonding the semiconductor elements to external connection terminals (see, for example, Patent Literature 1).

CITATION LIST

Patent Literature

Patent Literature 1: Japanese Patent Laid-open No. Hei 5(1993)-183071.

SUMMARY OF THE INVENTION

Problems to be Solved by the Invention

The mold-sealed semiconductor device described in Patent Literature 1 is sealed with a room-temperature glass coating. The room-temperature glass coating forms an $SiO_2$-based glass through dehydrocondensation of the silanol group. The $SiO_2$-based glass has a thermal expansion coefficient as low as that of the semiconductor elements. Therefore, there is a problem in which the $SiO_2$-based glass may cause a crack due to a thermal expansion difference between the $SiO_2$-based glass and a copper lead frame when used with a copper lead frame of high thermal conductivity.

Solution to Problems

In the present invention, there is provided a resin-sealed electronic control device including: a plurality of electronic elements; a substrate with the plurality of electronic elements mounted thereon; a bonding material that electrically connects the electronic elements to the substrate; and a sealing material that seals the plurality of elements and the substrate with a resin. The resin-sealed electronic control device further includes a glass coating that surrounds the plurality of electronic elements and the substrate on the outer side or inside of the sealing material. The glass coating is formed by melting a glass that contains vanadium and tellurium.

Advantages of the Invention

According to the present invention, there can be provided a resin-sealed electronic control device having a structure in which a glass coating surrounding a plurality of electronic elements and a substrate is formed on the outer side or inside of a sealing material. By being water impermeable, the glass coating prevents water absorption in the vicinity of electronic elements such as semiconductor chips and chip components, and can prevent an increase in the leak current of the semiconductor chip due to water absorption, and an insulation performance drop such as lowered insulation resistance caused by migration between the plurality of electronic elements.

DETAILED DESCRIPTION OF THE PREFERRED EMBODIMENTS

Preferred embodiments of a resin-sealed electronic control device according to the present invention will be described below with reference to the accompanying drawings.

First Embodiment

Structure of Resin-Sealed Electronic Control Device

Figure 1:
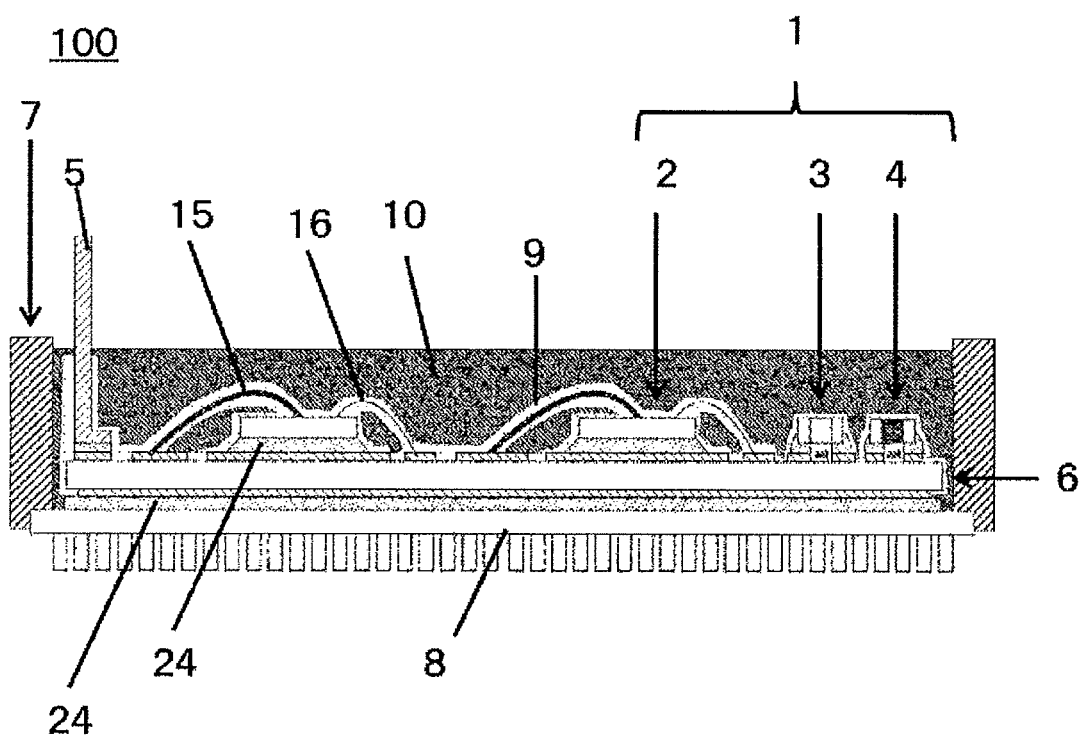
FIG. 1 is a schematic drawing showing a cross-sectional view of an exemplary resin-sealed electronic control device according to First Embodiment of the present invention.
Figure 20:
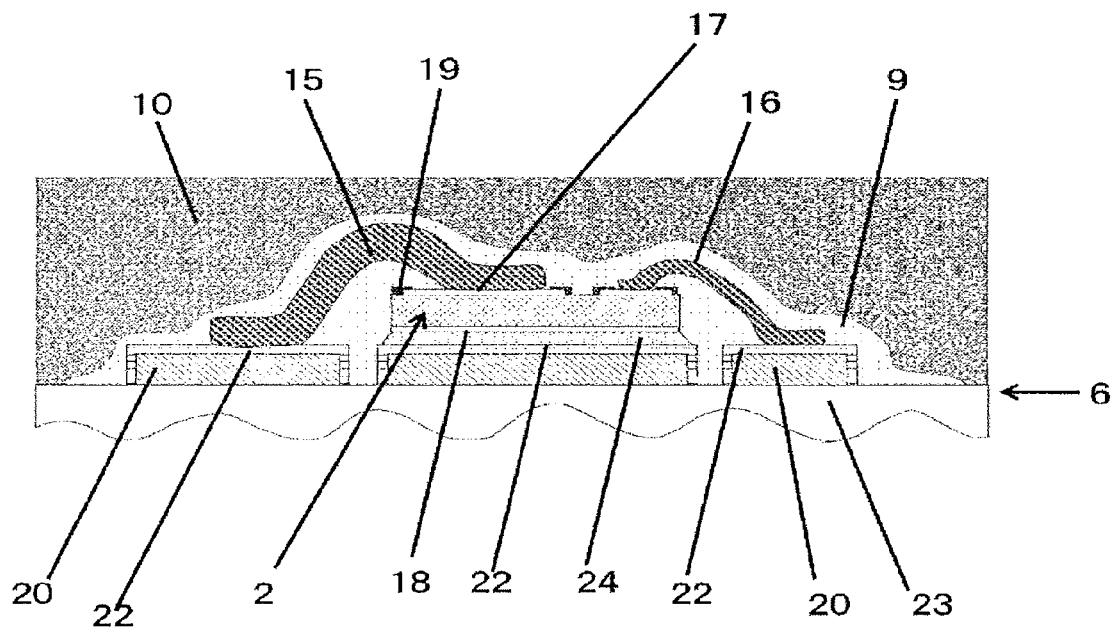
FIG. 20 is a schematic drawing showing a cross-sectional view in the vicinity of a semiconductor chip of the resin-sealed electronic control device shown in FIG. 1.

FIG. 1 is a schematic drawing showing a cross-sectional view of an exemplary resin-sealed electronic control device according to First Embodiment of the present invention. FIG. 20 is a schematic drawing showing a cross-sectional view in the vicinity of a semiconductor chip of the resin-sealed electronic control device shown in FIG. 1.

A resin-sealed electronic control device 100 includes a semiconductor chip 2, a chip capacitor 3, a chip resistor 4, a bonding member 5, a substrate 6, a case 7, a heat radiating plate 8, a glass coating 9, and a first sealing material 10. The glass coating 9 directly covers the electronic circuit configured with: an element group 1 including the semiconductor chip 2, the chip capacitor 3 and the chip resistor 4; the bonding member 5; and the substrate 6. The glass coating 9 is sealed by a first sealing material 10. By being water impermeable, the glass coating 9 prevents water absorption in the vicinity of the element group 1, and can prevent an increase in the leak current of the semiconductor chip 2 due to water absorption, and an insulation performance drop such as lowered insulation resistance caused by migration between the electronic elements forming the element group 1.

In the present embodiment, the glass coating 9 has a single continuous coating structure that extends to the back surface of the substrate 6, instead of simply covering the electronic elements one by one. The glass coating 9 can thus have a long coverage from the edges of the bonding interface to the element group 1 for the prevention of an increased leak current due to water absorption.

The element group 1 is a necessary component for electronic control, and includes chip components such as semiconductor chips (e.g., Si, SiC and GaN), chip resistors, and chip capacitors. These chip components are used together to form an electric circuit, and provide control functions.

The bonding member (15, 16, 24) is an electric conductive member that electrically connects the element group 1 and the substrate 6 to each other. A die bonding material 24 such as a solder, a conductive paste, a sintered metal and a conductive glass, and a bonding material such as an aluminum wire 16, an aluminum ribbon 15, and a copper wire may be used for the semiconductor chip 2. Materials such as a solder, a conductive paste, a sintered metal and a conductive glass may be used for other chip components.

Specifically, in the case of a semiconductor chip 2 bonded to a circuit formed on the substrate 6 by using silver or copper nanoparticles or by using a sintered metal obtained by reducing silver oxide or copper oxide as a bonding material, asperity and voids are formed on a surface of the bonding material. In such situations, the glass coating 9 provides an anchoring effect and can be prevented from being detached. The bonding strength can be further improved with the use of a vanadium-based glass (described later) that forms a diffusion layer with the metal.

The substrate 6 may be a substrate obtained by bonding an insulator 23 such as ceramics and resin with an electric conductive material such as a copper wiring 20 and an aluminum wiring. The substrate 6 may be solely of a metallic material such as a lead frame, as will be described in the variations later.

An insulator such as a thermoplastic resin may be used for the case 7. The case 7 may be a metallic case, or a molded case obtained by being molded by means of transfer molding, as in the variations to be described later.

The heat radiating plate 8 typically uses high heat conductive materials such as copper and aluminum. However, the heat radiating plate 8 may be omitted.

The first sealing material 10 may use thermosetting resins such as epoxy resin, silicone resin, silicone gel, and cyanate ester.

The glass coating 9 is preferably a lead-free glass from the standpoint of environmental protection. The thermal expansion coefficient thereof is desirably 12 ppm/° C. to 25 ppm/° C., more desirably 16 ppm/° C. to 23 ppm/° C. This is to prevent the temperature-induced detachment or cracking of the glass coating 9 bonded to the metallic materials forming the bonding member (15, 16, 24) and the substrate 6, for which, for example, simple metals and metal alloys (e.g., copper with a coefficient of thermal expansion of about 16 ppm/° C., silver with a coefficient of thermal expansion of about 19 ppm/° C., tin with a coefficient of thermal expansion of about 22 ppm/° C., and aluminum with a coefficient of thermal expansion of about 23 ppm/° C.), or composites of these metals with resin are used. With the glass coating 9 having the foregoing ranges of coefficient of thermal expansion, the coefficient of thermal expansion difference between the foregoing members and the glass coating 9 can be reduced, and the glass coating 9 can be prevented from being detached or cracked to improve reliability.

The glass coating 9 has a volume electric resistivity of desirably $1 \times 10^{10}$ Ωm or more. This is to provide sufficient insulation for the glass coating 9 that directly contacts the electric elements and the substrate forming the electric circuit.

It is preferable that the glass coating 9 is configured by heating vanadium-based glass to a temperature at or above its softening point. This is because vanadium-based glass forms a diffusion layer with metals such as copper, aluminum, tin and silver at or above a temperature of the softening point, and thereby adhering strongly to these metals. Heating vanadium-based glass at or above its softening point also allows the hydroxyl groups due to glass lattice defects to concentrate at the surface or interface of the glass, and improves the adhesion to ceramics such as oxides and semiconductors, and resins.

The glass used for the glass coating 9 has a softening point of desirably 300° C. or less. The reasons are as follows: The element group 1 usually includes an Si or SiC semiconductor chip with a coefficient of thermal expansion of about 4 ppm/° C., a GaN semiconductor chip with a coefficient of thermal expansion of about 6 ppm/° C., and chip components with a coefficient of thermal expansion of about 6 ppm/° C. Therefore, if using a glass having a softening point in excess of 300° C. for the glass coating 9, the thermal expansion difference between the element group 1 and the glass coating 9 becomes larger, and is prone to cause cracking in the glass coating 9.

The glass coating 9 is desirably a vanadium-based glass, as noted above. It is preferable that the vanadium-based glass for the glass coating 9 further contains $TeO_2$ in terms of an oxide component in addition to $V_2O_5$. In the vanadium-based glass, $V_2O_5$ forms a glass network structure and the $TeO_2$ lowers a softening point of the glass, resulting suppressing the decrease in the fluidity of molten glass due to a glass crystallization. The glass crystallization ratio is desirable 10% or less in order to reduce the influence of crystallization on fluidity.

It is preferable that the glass coating 9 contains $TeO_2$ in desirably 15 mass % or more of the total mass of the glass coating 9 to suppress crystallization. BaO and WO also may be added to the glass coating 9 in order to further suppress crystallization.

In addition, adding $Ag_2O$ to the glass coating 9 has effects to further lower the glass softening point, to increase the coefficient of thermal expansion of the glass, and to improve the adhesion to nickel metal such as a nickel plating 18. The $Ag_2O$ of appropriate amount can be incorporated in the $V_2O_5$ network, thereby precipitation of Ag metal being prevented. However, an excessively high $Ag_2O$ content makes it difficult to ensure insulation by precipitating the Ag metal. For the prevention of Ag metal precipitation, it is preferable to contain $Ag_2O$ in at most 2.6 times of the $V_2O_5$ content (in 2.6 times or less of the $V_2O_5$ content). Furthermore, from the viewpoint of a volume electric resistivity of the glass coating 9 of more than $1 \times 10^{10}$ Ωm, it is preferable to contain $Ag_2O$ in at most 2.2 times of the $V_2O_5$ content.

A glass softening point of the glass coating 9 of 300° C. or less can be achieved when the total content of $Ag_2O$, $V_2O_5$ and $TeO_2$ is 75 mass % or more in which the total mass of the glass forming the glass coating 9 is 100 mass %. Furthermore, it is preferable that the content of the $V_2O_5$ forming the glass network structure is 15 mass % to 40 mass % of the total mass of the glass forming the glass coating 9. With a $V_2O_5$ content above 40 mass %, the glass network structure becomes strong, and the softening point exceeds 300° C. On the other hand, a $V_2O_5$ content below 15 mass % weakens the glass network structure, and lowers the hydrolysis resistance and water fastness. The $V_2O_5$ content is thus preferably 15 mass % to 40 mass % of the total mass of the glass forming the glass coating 9.

The $V_2O_5$ content affects the softening point of the vanadium-based glass. The $Ag_2O$ content affects the volume electric resistivity of the vanadium-based glass. Moreover, the total content of $Ag_2O$ and $TeO_2$ affects the coefficient of thermal expansion of the vanadium-based glass.

A vanadium-based glass has a coefficient of thermal expansion of typically 10 ppm/° C. or less. In contrast, in the vanadium-based glass forming the glass coating 9, the coefficient of thermal expansion can be increased to 12 ppm/° C. or more when the total content of $Ag_2O$ and $TeO_2$ is 25 mass % or more and the $V_2O_5$ content is 45 mass % or less with respect to the total mass of the glass forming the glass coating 9. With these contents, the glass coating 9 can have a coefficient of thermal expansion of 12 ppm/° C. or more, and the coefficient of thermal expansion difference from the metallic materials of the resin-sealed electronic control device 100 can be reduced. This prevents more effectively the glass coating 9 from detaching from the materials covered with the glass coating 9.

Meanwhile, it is considered that the coefficient of thermal expansion of the glass forming the glass coating 9 increases with increasing the total content of $Ag_2O$ and $TeO_2$, because the Ag metal and the Te metal respectively have the coefficients of thermal expansion of about 19 ppm/° C. and about 17 ppm/° C., which are larger than that of about 8 ppm/° C. of the V metal.

The glass coating 9 can exhibit moisture resistance when it has a thickness of 1 μm or more. From the viewpoint of long-term reliability, it is desirable to have a thickness of 10 μm or more, because the glass coating 9 slowly undergoes hydrolysis in a high-temperature high-humidity environment. However, the thickness of 1 mm or less is desirable in order to reduce the amount of the glass used.

[Resin-Sealed Electronic Control Device Producing Method]

The following describes an exemplary method for producing the resin-sealed electronic control device of the embodiment, with reference to FIGS. 2(A) to 2(D).

Figure 2:
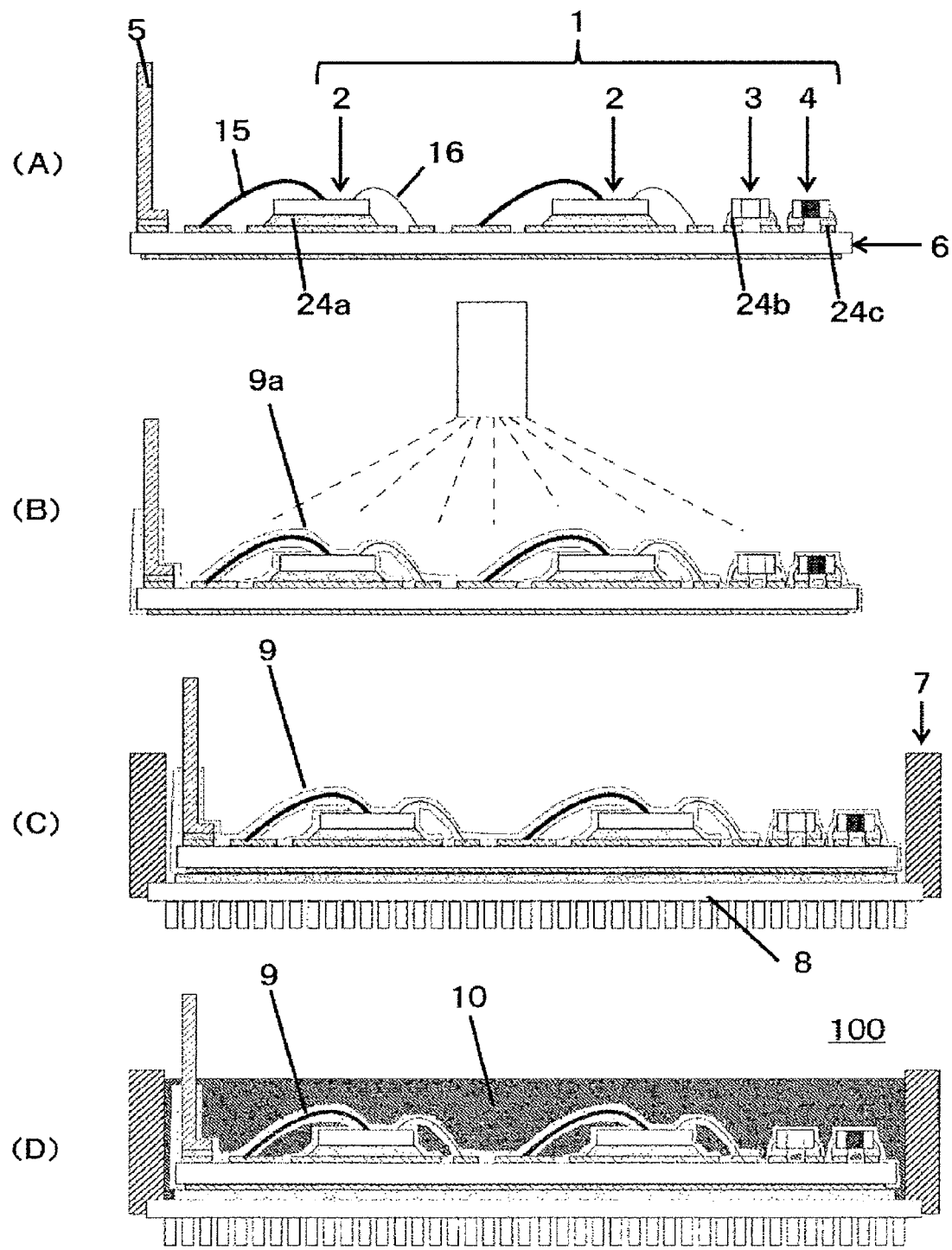
FIGS. 2(A) to 2(D) are schematic drawings showing cross-sectional views explaining a method for producing the resin-sealed electronic control device shown in FIG. 1.

As represented in FIG. 2(A), back surface electrodes of the semiconductor chips 2 are electrically connected to the substrate 6 having a ceramics insulating layer and the copper wiring 20 thereon by using a die bonding material 24a made of a sintered metal. The die bonding material 24a of sintered metal is formed by applying a paste of silver oxide and alcohol solvent and by heating the paste at a temperature of 250° C. or higher after mounting the semiconductor chips. Once formed, the sintered metal has high heat resistance that can withstand temperatures in the vicinity of the melting point of the metal.

Thereafter, the chip capacitors 3 and the chip resistors 4 are electrically connected with die bonding materials 24b and 24c made from a conductive paste. The conductive paste is a dispersion paste of a silver or copper powder dispersed in resin. The die bonding materials 24b and 24c are formed by heating the paste at 150° C. for 1 hour to cure the resin component after applying the paste and mounting the chip components including the chip capacitors 3 and the chip resistors 4. The cured resin has heat resistance that can withstand until the heat decomposition temperature.

The top surface electrodes of the semiconductor chips 2 are then electrically connected to the substrate 6 with the aluminum bonding wire 16. Meanwhile, there is a possibility that the aluminum bonding wire 16 forms a brittle and corrosive aluminum-copper alloy, if the aluminum bonding wire 16 is connected directly to the copper wiring 20 formed on the substrate 6. Therefore, the substrate copper wiring 20 is subjected to nickel plating to prevent formation of such an aluminum-copper alloy.

On the other hand, glass powder of predetermined composition (see, e.g., Table 1 described later) and having an average particle size of 2 μm or less is prepared. Thereafter, a paste is formed by dispersing the glass powder in a mixed solvent which is a mixture of a low-boiling-point-solvent having a boiling point of 150° C. or less, and a high-boiling-point solvent having a boiling point of 200° C. or more with a smaller amount. The paste is then applied to the surfaces of the element group 1, the bonding member (15, 16, 24), and the substrate 6 to form a paste layer 9a, as shown in FIG. 2(B). The paste layer 9a may be formed by either spraying the paste or dipping the components in the paste. Upon being applied, the paste layer 9a concentrates as the low-boiling-point-solvent vaporizes, leaving the high-boiling-point solvent. This prevents powderization, and forms a dense film. It is desirable to mask the substrate 6 in areas where the semiconductor chips are not mounted, so that the paste layer 9a does not adhere to these portions of the substrate 6.

Figure 19:
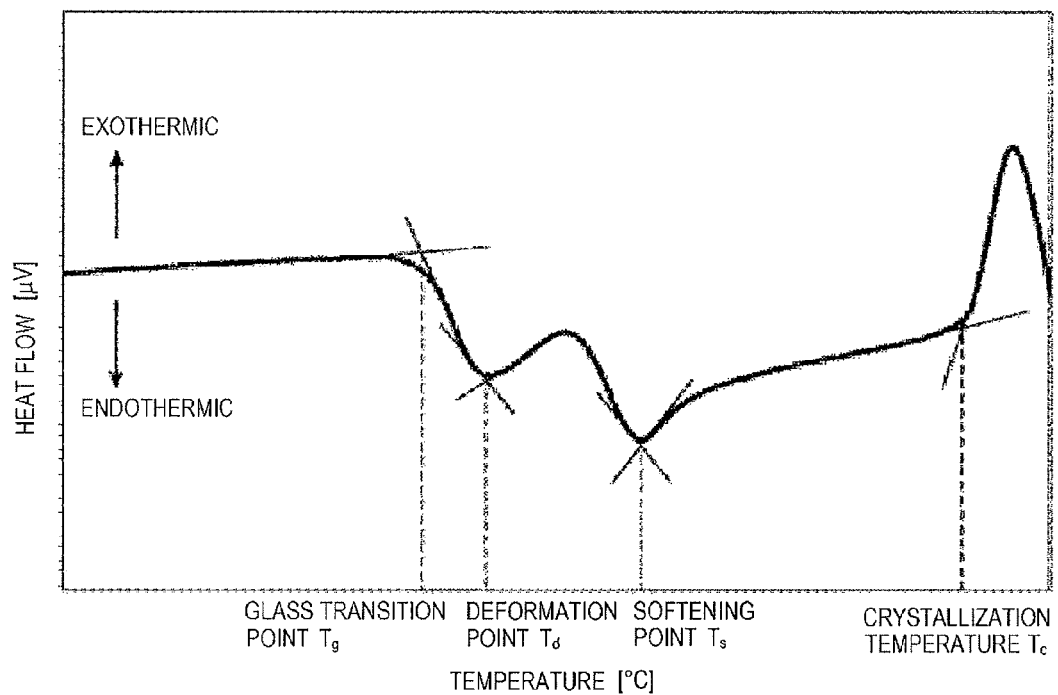
FIG. 19 shows an example of a DTA curve obtained in a DTA measurement of a glass composition.

Thereafter, the paste layer 9a is heated to or above the glass softening point with heated air or infrared irradiation to cure the paste layer 9a and form the glass coating 9. It is preferable that the paste layer 9a is heated in such a temperature profile heating a predetermined peak temperature after pre-heating a temperature in the vicinity of the boiling point of the high-boiling-point solvent. The peak temperature will be described later with reference to FIG. 19. Film defects due to uprush solvent vaporization can be prevented through such a heating profile. The glass coating 9 formed by the heating the vanadium-based glass at or above its softening point can exhibit excellent adhesion to the metal, ceramic, semiconductors, and resin.

Furthermore, by adding $Ag_2O$ to the vanadium-based glass, the glass coating 9 can exhibit good adhesion to a nickel metal, for example, a nickel plated surface. The bonding member (15, 16, 24) directly contacts with the glass coating 9, therefore the bonding member needs to have a heat resistant to a temperature equal to or greater than the glass softening point. To this end, it is preferable to use a sintered metal for the bonding portion between the semiconductor chip 2 and the copper wiring 20.

Next, the back surface of the substrate 6 opposite to the semiconductor chip mounting surface is soldered to the heat radiating plate 8 that has been bonded to the case 7 with a silicone adhesive, as shown in FIG. 2(C).

Finally, as shown in FIG. 2(D), the first sealing material 10 made of a silicone gel or an epoxy resin is injected into the case, and is heat-cured to obtain the resin-sealed electronic control device 100.

According to this embodiment of the invention, the glass coating 9 directly covers the conductive members including the element group 1, the wirings of the substrate 6, and the bonding members (15, 16, 24), and exhibits excellent adhesion to the constitution members. This makes it possible to ensure high reliability even in a moist, salinity environment such as an offshore environment.

Variations of First Embodiment

Figure 3:
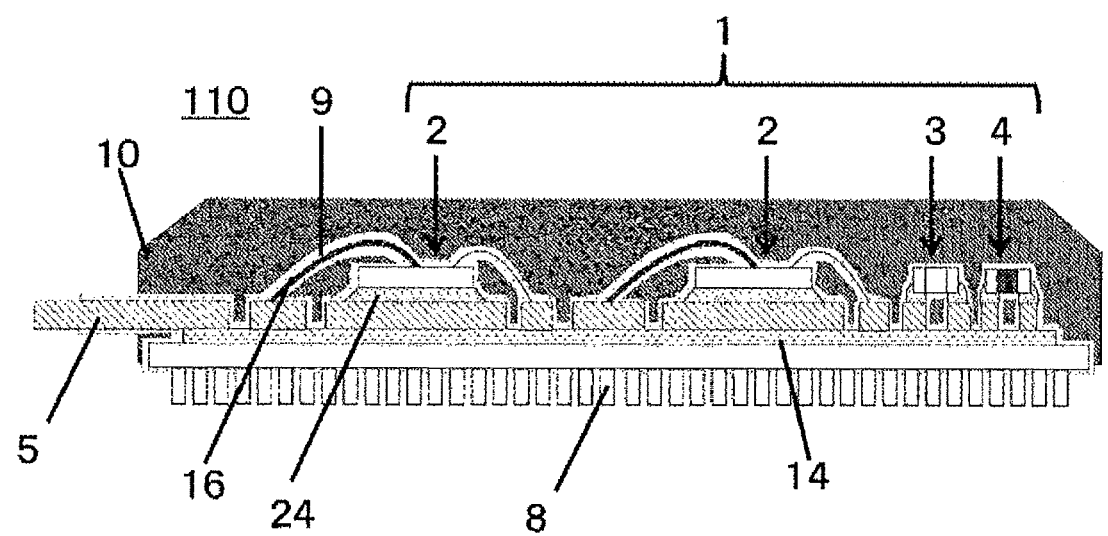
FIG. 3 is a schematic drawing showing a cross-sectional view of another example (variation 1) of the resin-sealed electronic control device of First Embodiment of the present invention.

FIG. 3 is a schematic drawing showing a cross-sectional view of another example (variation 1) of the resin-sealed electronic control device of First Embodiment.

The structure and the method of production of resin-sealed electronic control device 110 of this variation will be described below.

The present variation differs from the aforementioned example in that the resin-sealed electronic control device 110 of variation 1 uses, instead of the substrate 6, a combined body comprising a lead frame 5 and a heat radiating plate 8 which are bonded to each other with a high-heat-conductivity resin 14. Each of the lead frame 5, the heat radiating plate 8, and the high-heat-conductivity resin 14 is covered with the glass coating 9. With this configuration, the cost and the weight of the resin-sealed electronic control device can be reduced. In addition, the water absorption that occurs in the vicinity of the electric elements can be prevented even when the high-heat-conductivity resin 14 replacing the substrate 6 is highly hygroscopic.

Furthermore, because the first sealing material 10 is transfer molded after forming the glass coating 9, the case 7 is not necessary in the present variation. The resin-sealed electronic control device 110 is thus less expensive and becomes lighter than that described in the aforementioned example.

The following describes a method for producing the resin-sealed electronic control device 110 of the present variation.

As described above, a combined body comprising the copper lead frame 5 and the aluminum heat radiating plate 8 which are bonded to each other with the high-heat-conductivity resin 14 is used in place of the substrate 6. The back surface electrodes of the semiconductor chips 2 are electrically connected to the combined body (lead frame 5) with the die bonding material 24 made of sintered metal. The top surface electrodes of the semiconductor chips 2 are then electrically connected to the lead frame 5 with the aluminum bonding wire 16. Because the aluminum bonding wire 16 is prone to form a brittle and corrosive aluminum-copper alloy if the aluminum bonding wire 16 is connected directly to the copper, the lead frame 5 is subjected to nickel plating to prevent formation of such an aluminum-copper alloy.

On the other hand, glass powder of the predetermined composition such as shown in Table 1 and having an average particle size of 2 μm or less is prepared. Thereafter, a paste is formed by dispersing the glass powder in a solvent. The paste is then applied to parts of the lead frame 5, the element group 1, the high-heat-conductivity resin 14, and the heat radiating plate 8, either by spraying the paste over these components, or by dipping the components in the paste.

Thereafter, the paste layer is heated to or above the glass softening point with heated air or infrared irradiation to form the glass coating 9. The glass coating 9 formed by the heating the vanadium-based glass at or above its softening point can exhibit excellent adhesion to the metal, ceramic, semiconductor, and resin.

Next, the first sealing material 10 is transfer molded to obtain the resin-sealed electronic control device 110. The glass coating 9 directly covers the conductive members, including the element group 1, the wirings of the substrate 6, and the bonding members (15, 16, 24), and exhibits excellent adhesion to the constitution members. This makes it possible to ensure high reliability even in a moist, salinity environment such as an offshore environment.

Meanwhile, it is preferable that the glass coating 9 has a continuous body from the element group 1 to the back surface of the heat radiating plate 8. With this configuration, the glass coating 9 can have a long coverage from the edges of the bonding interface to the element group 1 for the prevention of an increased leak current due to water absorption.

Besides, in the resin-sealed electronic control device 110 shown in FIG. 3, the glass coating 9 covers a part of the surface of the lead frame 5 projecting from the sealing material 10 so as to extend outward from the sealing material 10, together with the lead frame 5. However, the glass coating 9 may be covered with the sealing material 10 so as not to project outward from the sealing material 10. In this way, the edges of the bonding interface of the glass coating 9 to the element group 1 does not come into contact with ambient air, and an increased leak current due to water absorption can be prevented more effectively.

Figure 4:
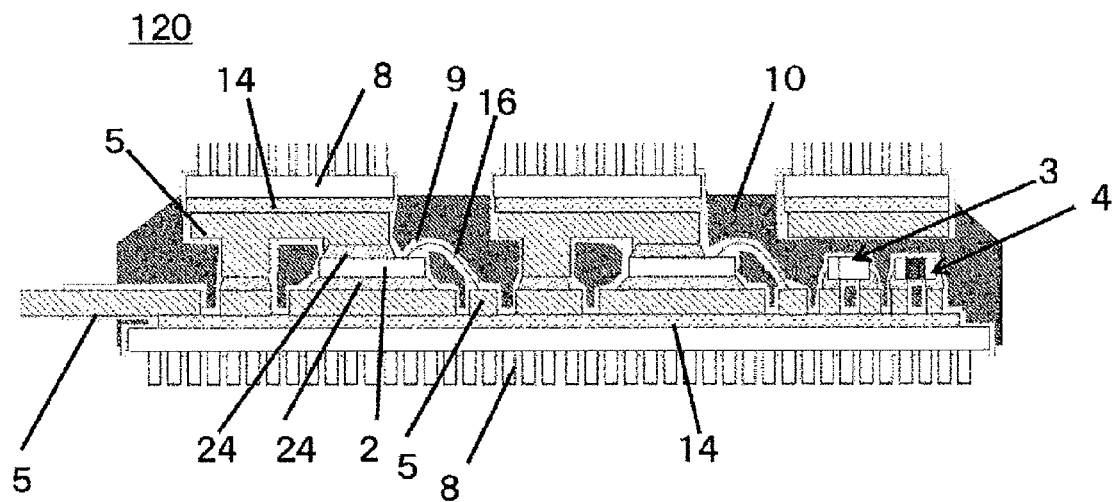
FIG. 4 is a schematic drawing showing a cross-sectional view of still another example (variation 2) of the resin-sealed electronic control device of First Embodiment of the present invention.

FIG. 4 is a schematic drawing showing a cross-sectional view of still another example (variation 2) of the resin-sealed electronic control device of First Embodiment. The resin-sealed electronic control device 120 of variation 2 differs from that of variation 1 in that the substrate 6 as the bonded unit of the lead frame 5 and that the heat radiating plates 8 with the high-heat-conductivity resin 14 are bonded to the both surfaces of the semiconductor chips 2. With this configuration, the resin-sealed electronic control device 120 can be provided with improving the radiation performance as well as improving the reliability at low cost.

In addition, in this variation, another heat radiating plate 8 is provided so as to face the surfaces of the chip capacitor 3 and the chip resistor 4. With this configuration, the generated heat from the chip capacitor 3 and the chip resistor 4 can be released from both the top and the bottom surfaces, and the radiation performance improves.

A method for producing the resin-sealed electronic control device 120 will be described below. In this variation, a combined body comprising the copper lead frame 5 and the aluminum heat radiating plate 8 that are bonded to each other with the high-heat-conductivity resin 14 is used in place of the substrate 6. And, each of the combined bodies is electrically connected respectively to the top and the back surface electrodes of the semiconductor chips 2 with the die bonding material 24 made of sintered metal.

Thereafter, the first sealing material 10 is transfer molded after forming the glass coating 9 in order to obtain the resin-sealed electronic control device. The glass coating 9 directly covers the high-heat-conductivity resin 14, in addition to the conductive members including the element group 1, the lead frame 5, and the bonding members (15, 16, 24), and exhibits excellent adhesion to the constitution members. This makes it possible to ensure high reliability even in a moist, salinity environment such as an offshore environment. Moreover, the cooling performance is improved by the provision of the heat radiating plate 8 on the both sides of the chip capacitor 3 and the chip resistor 4.

Figure 5:
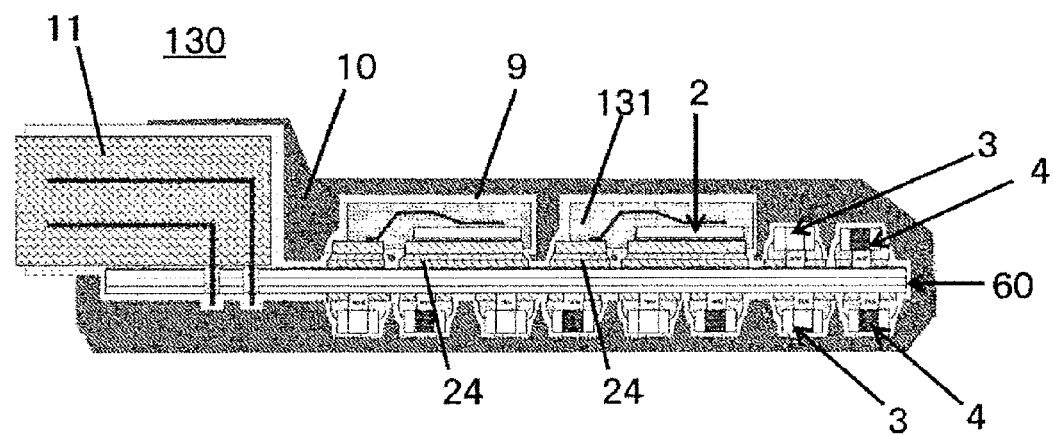
FIG. 5 is a schematic drawing showing a cross-sectional view of still another example (variation 3) of the resin-sealed electronic control device of First Embodiment of the present invention.

FIG. 5 is a schematic drawing showing a cross-sectional view of still another example (variation 3) of the resin-sealed electronic control device of First Embodiment. In the resin-sealed electronic control device 130, a printed circuit board 60 including a resin insulating layer is used as the substrate, and the first sealing material 10 is transfer molded after forming the glass coating 9. The printed circuit board 60 allows forming a complex circuit at low cost.

In addition, in this variation, it is preferable that the glass coating 9 has a continuous body covering all the electronic elements provided on both the top and the bottom surfaces of the printed circuit board 60, as shown in FIG. 5. With this configuration, the glass coating 9 can have a long coverage from the edges of the bonding interface to the electronic elements, and prevent an increased leak current due to water absorption.

Moreover, in this variation, the semiconductor chips 2 that generate large heat are covered with a resin material 131, and the glass coating 9 is provided over these components. With this configuration, the thermal stress caused by repeating the heat generation can be absorbed by the softness of the resin material 131. This leads to reducing detachment of the glass coating 9 from the semiconductor chips 2 than directly covering the semiconductor chips 2 with the glass coating 9.

A method for producing the resin-sealed electronic control device 130 will be described below. In this variation, the printed circuit board 60 is used as the substrate. And, the resin-sealed semiconductor chips 2, the chip capacitors 3, the chip resistors 4, and a waterproof connector 11 are electrically bonded to the printed circuit board 60 by means of the die bonding material 24 made of a conductive paste. The conductive paste is formed by applying a paste of a silver or copper powder dispersed in resin. The electrical bonding is conducted by heating the paste at 150° C. for 1 hour to cure the resin component after applying the paste and mounting the chip components including the chip capacitors and the chip resistors thereon. The cured resin has heat resistance that can withstand up to the heat decomposition temperature thereof.

On the other hand, glass powder of the predetermined composition such as shown in Table 1 and having an average particle size of 2 µm or less is prepared. Thereafter, a paste is formed by dispersing the glass powder in a solvent. The paste is then applied to both the top and the bottom surfaces of the printed circuit board 60 on which the electronic components have been mounted, either by spraying the paste over these components or by dipping the printed circuit board 60 into the paste.

Thereafter, the paste layer is heated to or above the glass softening point with heated air or infrared irradiation to form the glass coating 9. Herein, it is preferable that the glass coating 9 is formed also on the surface of the waterproof connector 11. With this configuration, the waterproof connector improves the waterproofness further, and the resin-sealed electronic control device 130 can exhibit higher reliability.

The glass coating 9 directly seals the conductive members including the element group 1, the wirings of the printed circuit board 60, the bonding members (15, 16, 24), and the waterproof connector 11, and has excellent adhesion to these members. This makes it possible to ensure high reliability even in a moist, salinity environment such as an offshore environment.

In this variation, there is another advantage in which the resin-sealed electronic control device 130 can be electrically connected to other devices easily, by means of the provision of the waterproof connector 11.

The resin-sealed electronic control devices according to the present invention may be implemented in various embodiments.

The following describes Second to Eighth Embodiments.

The advantages of the present invention also will be described in detail by comparing results of various tests conducted for each embodiment and a comparative example.

Second Embodiment

A resin-sealed electronic control device 200 of Second Embodiment differs from those of First Embodiment in that an insulating resin coating 12 is formed on the surfaces of the element group 1, the bonding members (15, 16, 24), and the substrate 6 before forming the glass coating 9.

Figure 6:
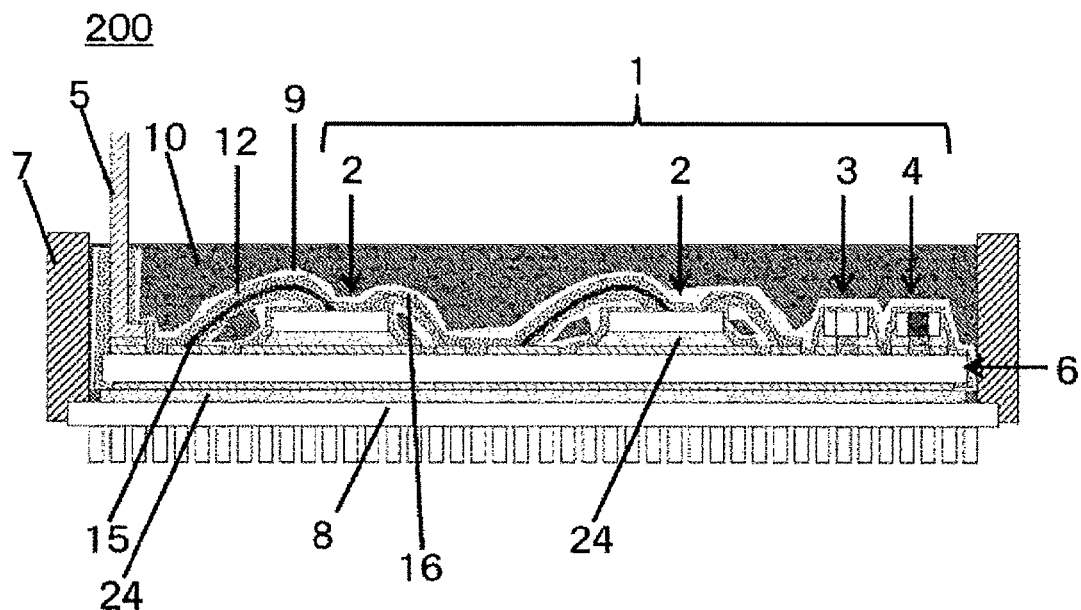
FIG. 6 is a schematic drawing showing a cross-sectional view of an exemplary resin-sealed electronic control device according to Second Embodiment of the present invention.

FIG. 6 is a schematic drawing showing a cross-sectional view of an exemplary resin-sealed electronic control device according to Second Embodiment.

In the resin-sealed electronic control device 200, an insulating resin capable of forming a coating film can be used as an insulating resin coating 12. Examples of the insulating resin include polyimide, polyamide imide, acrylic resin, and silicone resin. A thickness of the insulating resin coating 12 may be less than 1 μm for sufficient insulation performance when the glass coating 9 having a volume electrical resistivity of $1 \times 10^{10}$ Ωm or more is provided.

On the other hand, when the glass coating 9 having a volume electrical resistivity of less than $1 \times 10^{10}$ Ωm is provided, the insulating resin coating 12 is required to have a thicknesses of 1 μm or greater for sufficient insulation performance. And, the glass coating 9 is desired to be disposed sufficiently away from the potential-generating conductive portion.

When the glass coating 9 having a volume electrical resistivity of less than $1 \times 10^{10}$ Ωm is used and disposed near a conductive portion of a single potential, the insulating resin coating 12 is desired to have a thickness of 100 μm or more in order to ensure sufficient insulation. However, resin materials used as the insulating resin coating 12 are relatively expensive. So, a thickness of the insulating resin coating 12 is desired to be 1 mm or less in order to save the amount of the material used.

In this embodiment, the element group 1, the substrate 6, and the bonding members (15, 16, 24) forming the electric circuit are covered with the insulating resin coating 12, and the glass coating 9 is provided thereover. With this configuration, the thermal stress generated by the thermal expansion and contraction of the element group 1 and other elements can be absorbed by the insulating resin coating 12. Furthermore, this configuration in which the insulating resin coating 12 exists between the constitution elements and the glass coating 9 relaxes restriction of the volume electrical resistivity of the glass coating 9, and the $Ag_2O$ content in the glass coating 9 can be increased.

In other words, with an increased $Ag_2O$ content, the glass coating 9 can have a lower softening point and an increased coefficient of thermal expansion, and makes it possible to reduce the processing cost.

A solder having a melting point lower than the glass softening point can be used as the bonding member 5. This is because the existence of the insulating resin coating 12 between the glass coating 9 and the coated components including the element group 1, the bonding members (15, 16, 24) and the substrate 6 prevents contents of the solder from diffusing into the glass coating 9 and lowering the volume electrical resistivity thereof. Unlike the variation 3 of First Embodiment, the insulating resin coating 12 is provided on all the constitution elements. Therefore, the thermal stress generated by the thermal expansion and contraction of the chip capacitor 3 and the chip resistor 4 can be also absorbed by the insulating resin coating 12.

Figure 7:
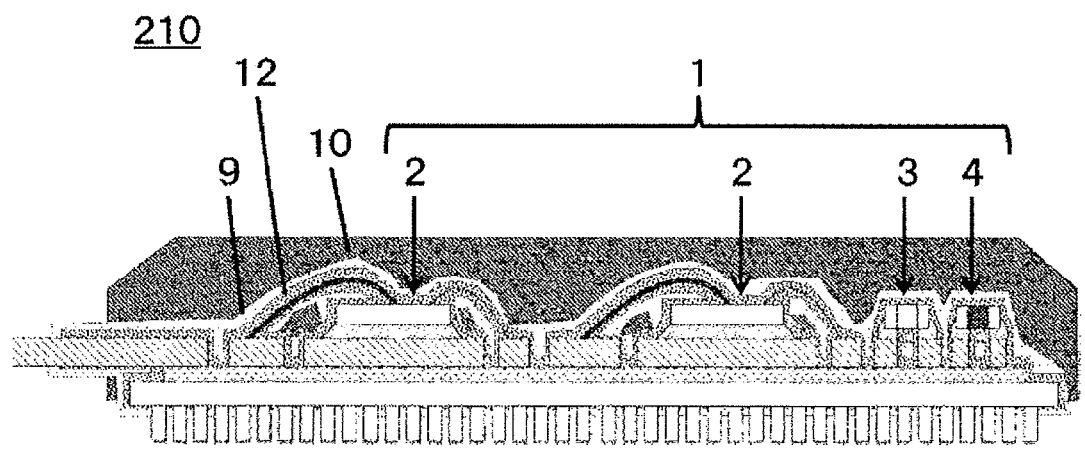
FIG. 7 is a schematic drawing showing a cross-sectional view of another example (variation 1) of the resin-sealed electronic control device of Second Embodiment of the present invention.

FIG. 7 is a schematic drawing showing a cross-sectional view of another example (variation 1) of the resin-sealed electronic control device of Second Embodiment. The resin-sealed electronic control device 210 of this variation of Second Embodiment differs from that of the variation 1 of First Embodiment (shown in FIG. 3) in a point that the insulating resin coating 12 is formed around the element group 1, the bonding members (15, 16, 24), and the lead frame 5.

With this configuration, the thermal stress generated by the thermal expansion and contraction of the element group 1 and other elements can be absorbed by the insulating resin coating 12, in addition to the advantages of the variation 1 of First Embodiment. Furthermore, this configuration relaxes restriction of the volume electrical resistivity imposed on the glass coating 9.

Figure 8:
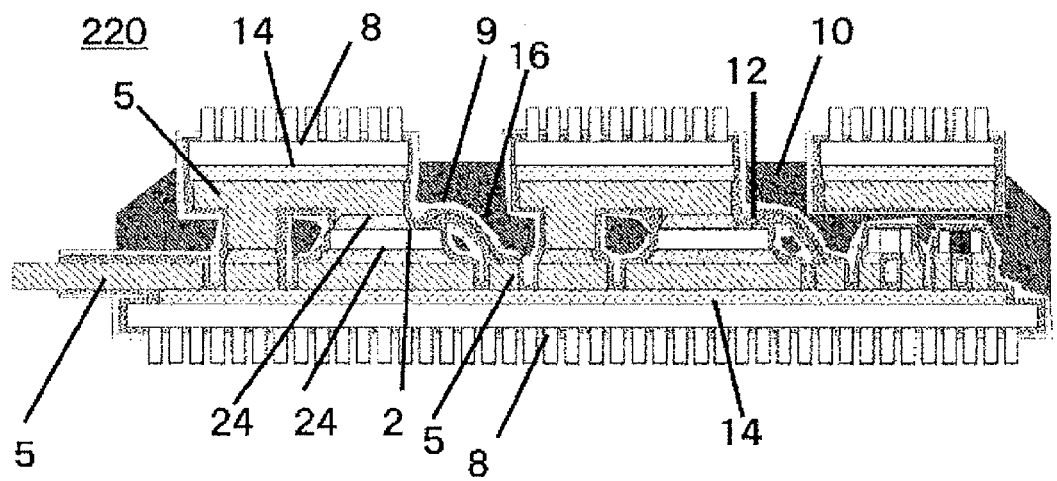
FIG. 8 is a schematic drawing showing a cross-sectional view of still another example (variation 2) of the resin-sealed electronic control device of Second Embodiment of the present invention.

FIG. 8 is a schematic drawing showing a cross-sectional view of still another example (variation 2) of the resin-sealed electronic control device of Second Embodiment. The resin-sealed electronic control device 220 of this variation of Second Embodiment differs from that of the variation 2 of First Embodiment (shown in FIG. 4) in a point that the insulating resin coating 12 is formed around the element group 1, the bonding members (15, 16, 24), and the lead frame 5.

With this configuration, the thermal stress generated by the thermal expansion and contraction of the element group 1 and other elements can be absorbed by the insulating resin coating 12, in addition to the advantages of the variation 2 of First Embodiment. Furthermore, this configuration relaxes restriction of the volume electrical resistivity imposed on the glass coating 9.

Moreover, in this variation, the insulating resin coating 12 extends to the back surface of the heat radiating plate 8, and the glass coating 9 is provided over the insulating resin coating 12. The glass coating 9 thus provides a complete coverage over the insulating resin coating 12 that is susceptible to water absorption, and then the resin-sealed electronic control device 220 can exhibit improved waterproofness.

Figure 9:
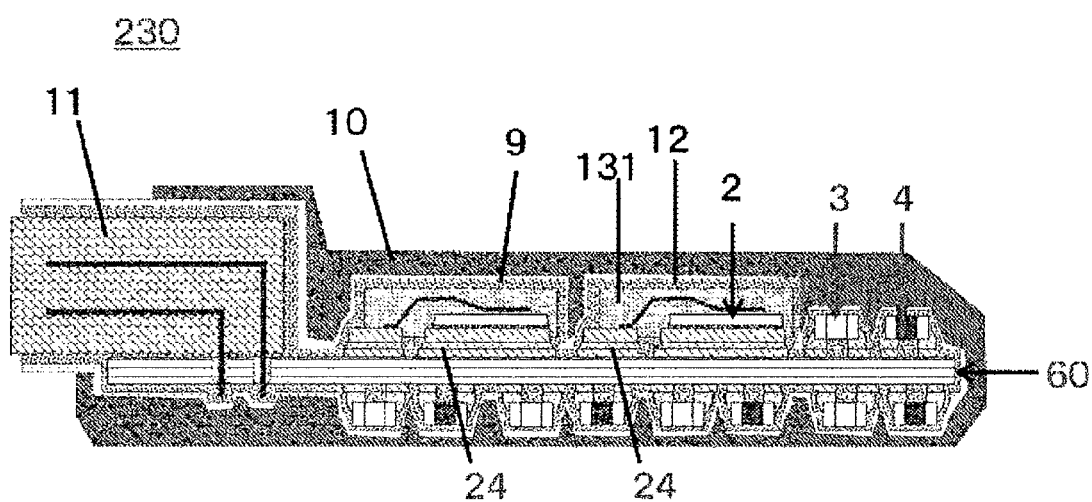
FIG. 9 is a schematic drawing showing a cross-sectional view of still another example (variation 3) of the resin-sealed electronic control device of Second Embodiment of the present invention.

FIG. 9 is a schematic drawing showing a cross-sectional view of still another example (variation 3) of the resin-sealed electronic control device of Second Embodiment. The resin-sealed electronic control device 230 of this variation of Second Embodiment differs from that of the variation 3 of First Embodiment (shown in FIG. 5) in a point that the insulating resin coating 12 is formed around the element group 1, the bonding members (15, 16, 24), and the waterproof connector 11.

With this configuration, the thermal stress generated by the thermal expansion and contraction of the element group 1 and other elements can be absorbed by the insulating resin coating 12, in addition to the advantages of the variation 3 of First Embodiment. Furthermore, this configuration relaxes restriction of the volume electrical resistivity imposed on the glass coating 9.

Moreover, in this variation, the semiconductor chips 2 that generate particularly large heat are covered with the resin material 131, and the insulating resin coating 12 is formed on the outer side of the resin material 131. The glass coating 9 is then provided over the insulating resin coating 12. With this configuration, the thermal stress caused by repeating the heat generation can be absorbed by the softness of the resin material 131 and the insulating resin coating 12. This leads to further suppressing detachment of the glass coating 9 than covering the glass coating 9 directly over the resin material 131 formed on the semiconductor chips 2.

Third Embodiment

Resin-sealed electronic control devices (300, 310, 320, 330) of Third Embodiment differs from those of First Embodiment in a point that a second sealing material 13 surrounding a whole of the element group 1 and the bonding members (15, 16, 24) is formed before forming the glass coating 9.

Figure 10:
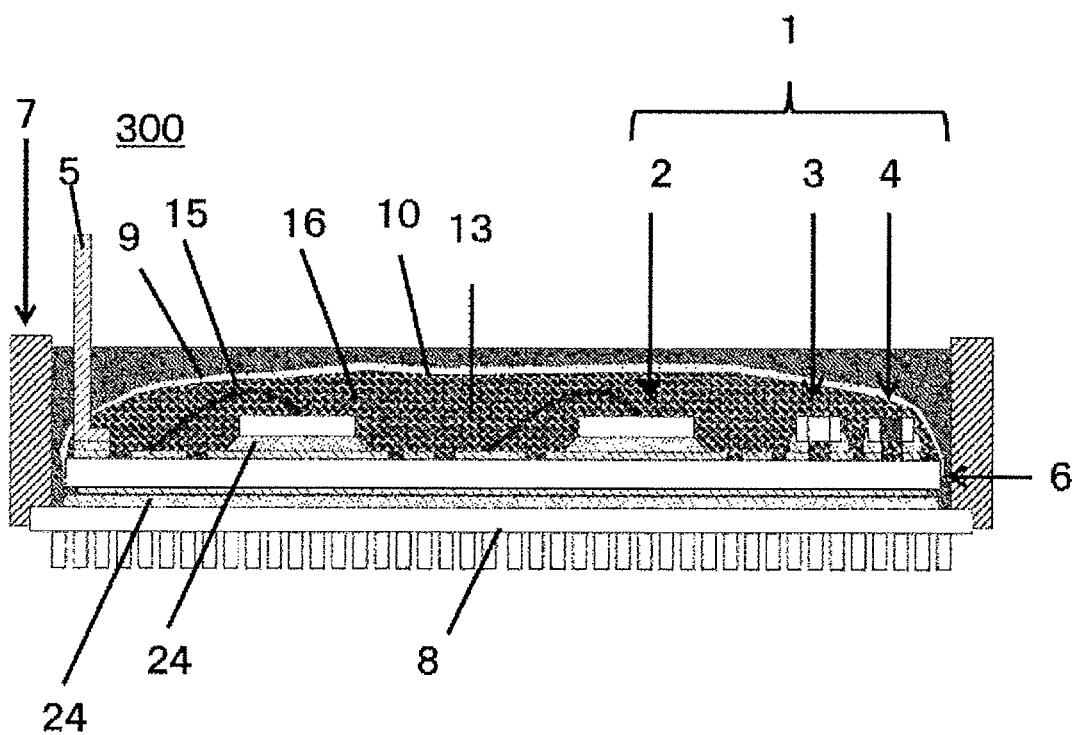
FIG. 10 is a schematic drawing showing a cross-sectional view of an exemplary resin-sealed electronic control device according to Third Embodiment of the present invention.

FIG. 10 is a schematic drawing showing a cross-sectional view of an exemplary resin-sealed electronic control device of Third Embodiment. In the resin-sealed electronic control device 300, the second sealing material 13 is formed over the element group 1 as surrounding a whole of the element group 1, and the glass coating 9 is provided over the second sealing material 13.

The second sealing material 13 may use an insulating resin that can retain its shape by the thixotropic nature of the material. Examples include epoxy resin and silicone resin. Because the resin seal 13 surrounds a whole of the element groups 1, the surface of the resin seal 13, which becomes an interface with the glass coating 9, becomes a surface with fewer irregularities. This is advantageous in preventing defects in coating the glass. In order to prevent cracking during the formation of the glass coating 9, it is desirable that the second sealing material 13 has the same or similar coefficient of thermal expansion as the glass coating 9.

Furthermore, the glass coating 9 is protected by the first sealing material 10, and is not in contact with external environment. This prevents cracking and chipping of the glass coating 9, and improves reliability even when a thickness of the glass coating 9 is as thin as 100 µm or less.

By covering all elements with the second sealing material 13 as in this Embodiment, the coverage provided by the sealing material becomes wider than that in Second Embodiment, and the heat dissipation improves as the wider coverage of the second sealing material 13 promotes the thermal diffusion.

Furthermore, because the glass coating 9 is not in direct contact with the element group 1, there is no need to mind the restriction of the volume electrical resistivity of the glass coating 9. This allows for use of a glass coating 9 having a large $Ag_2O$ content and a low softening point, and enables reducing the processing cost.

In other words, because the softening point of the glass coating 9 can be lowered, the heat deterioration of the second sealing material 13 which might occur under the heat treatment for the formation of the glass coating 9 can be suppressed.

Figure 11:
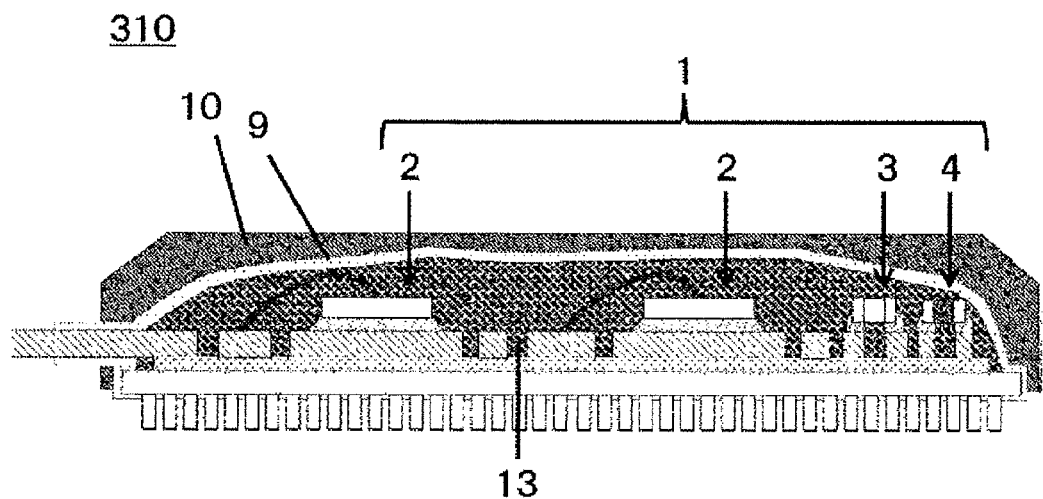
FIG. 11 is a schematic drawing showing a cross-sectional view of another example (variation 1) of the resin-sealed electronic control device of Third Embodiment of the present invention.

FIG. 11 is a schematic drawing showing a cross-sectional view of another example (variation 1) of the resin-sealed electronic control device of Third Embodiment. The resin-sealed electronic control device 310 of this variation of Third Embodiment differs from that of the variation 1 of First Embodiment (shown in FIG. 3) in a point that the second sealing material 13 is formed over the element group 1 as surrounding a whole of the element group 1, and the glass coating 9 is provided over the second sealing material 13.

With this configuration, the following advantages can be obtained, in addition to the advantages of the variation 1 of First Embodiment.

By covering all elements with the second resin material, the coverage provided by the resin material in this Embodiment becomes wider than that in Second Embodiment, and the heat dissipation improves as the wider coverage of the second resin material promotes the thermal diffusion.

Furthermore, because the glass coating 9 is not in direct contact with the element group 1, there is no need to mind the restriction of the volume electrical resistivity of the glass coating 9. This allows for use of a glass coating 9 having a large $Ag_2O$ content and a low softening point, and enables reducing the processing cost.

Figure 12:
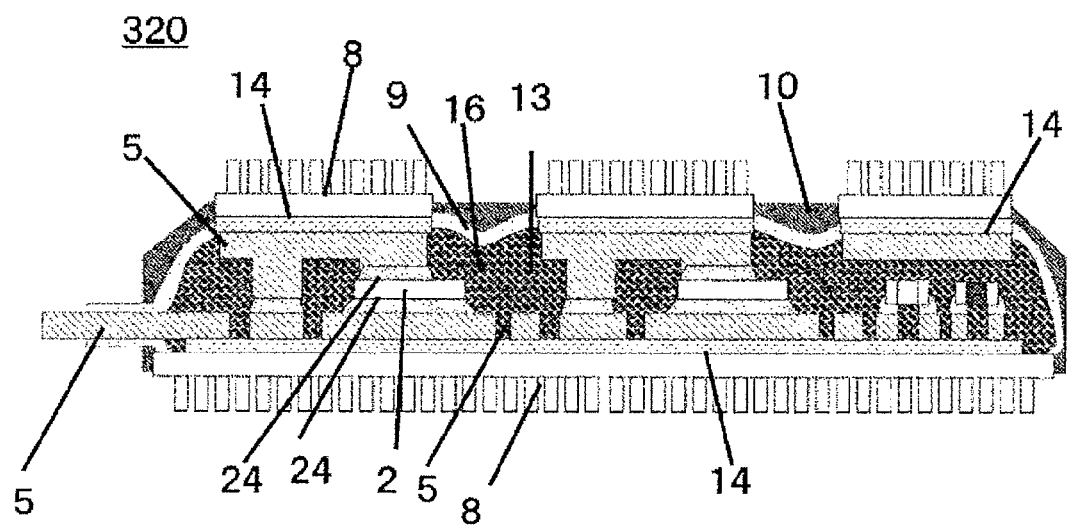
FIG. 12 is a schematic drawing showing a cross-sectional view of still another example (variation 2) of the resin-sealed electronic control device of Third Embodiment of the present invention.

FIG. 12 is a schematic drawing showing a cross-sectional view of still another example (variation 2) of the resin-sealed electronic control device of Third Embodiment. The resin-sealed electronic control device 320 of this variation of Third Embodiment differs from that of the variation 2 of First Embodiment (shown in FIG. 4) in a point that the second sealing material 13 is formed over the element group 1 as surrounding a whole of the element group 1, and the glass coating 9 is provided over the second sealing material 13.

With this configuration, the following advantages can be obtained, in addition to the advantages of the variation 2 of First Embodiment.

By covering all elements with the second resin material, the coverage provided by the resin material in this Embodiment becomes wider than that in Second Embodiment, and the heat dissipation improves as the wider coverage of the second resin material promotes the thermal diffusion.

Furthermore, because the glass coating 9 is not in direct contact with the element group 1, there is no need to mind the restriction of the volume electrical resistivity of the glass coating 9. This allows for use of a glass coating 9 having a large $Ag_2O$ content and a low softening point, and enables reducing the processing cost.

On the other hand, in this variation, the glass coating 9 does not extend to the back surface of the heat radiating plate 8, and the back surface of the heat radiating plate 8 is exposed. In this way, the heat transferred to the heat radiating plate 8 can be released directly into ambient air, and the heat dissipation of the heat radiating plate 8 is improved over the variation 3 of First Embodiment.

Figure 13:
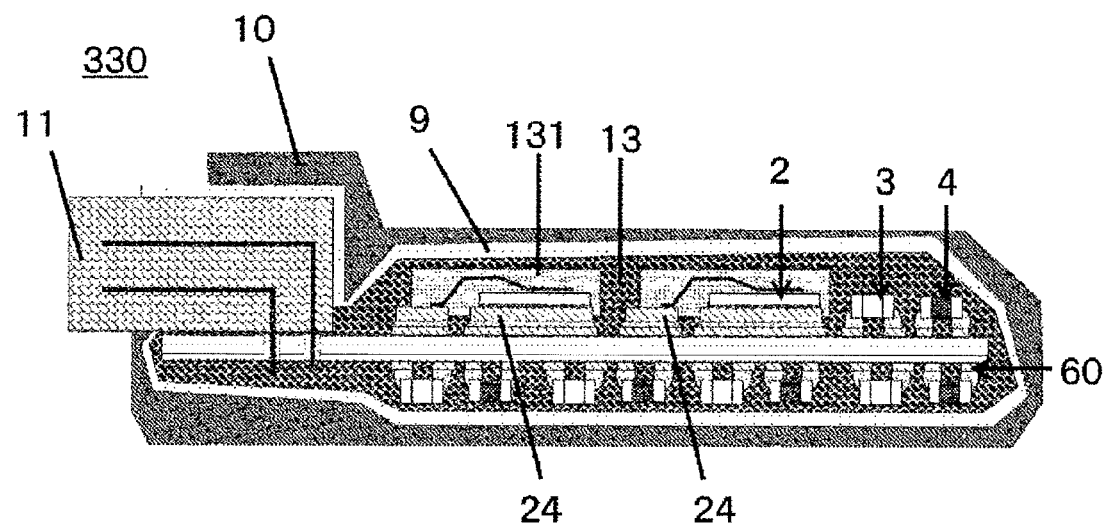
FIG. 13 is a schematic drawing showing a cross-sectional view of still another example (variation 3) of the resin-sealed electronic control device of Third Embodiment of the present invention.

FIG. 13 is a schematic drawing showing a cross-sectional view of still another example (variation 3) of the resin-sealed electronic control device of Third Embodiment. The resin-sealed electronic control device 330 of this variation of Third Embodiment differs from that of the variation 3 of First Embodiment (shown in FIG. 5) in a point that the second sealing material 13 is formed over the element group 1 as surrounding a whole of the element group 1, and the glass coating 9 is provided over the second sealing material 13.

With this configuration, the following advantages can be obtained, in addition to the advantages of the variation 3 of First Embodiment.

By covering all elements with the second sealing material, the coverage provided by the resin material in this Embodiment becomes wider than that in Second Embodiment, and the heat dissipation improves as the wider coverage of the second resin material promotes the thermal diffusion.

Furthermore, because the glass coating 9 is not in direct contact with the element group 1, there is no need to mind the restriction of the volume electrical resistivity of the glass coating 9. This allows for use of a glass coating 9 having a large $Ag_2O$ content and a low softening point, and enables reducing the processing cost.

Moreover, in this variation, the semiconductor chips 2 that produce particularly large heat are covered with the resin material 131, and the second sealing material 13 is formed on the outer side of the resin material 131. The glass coating 9 is then provided over the second sealing material 13. With this configuration, the thermal stress caused by repeating the heat generation can be absorbed by both the soft resin material 131 and the even softer second sealing material 13. This leads to further suppressing detachment of the glass coating 9.

Fourth Embodiment

Resin-sealed electronic control devices (400, 410, 420, 430) of Fourth Embodiment differs from those of First Embodiment in a point that the glass coating 9 is formed on the outermost side of the resin-sealed electronic control device.

Figure 14:
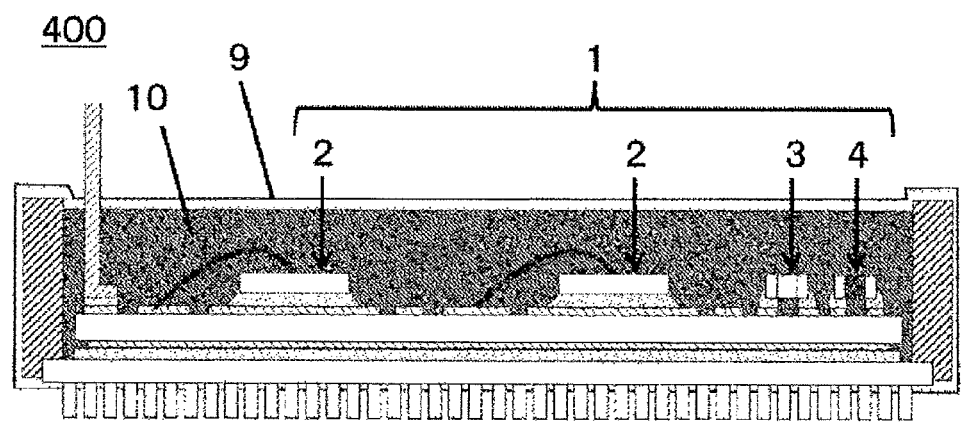
FIG. 14 is a schematic drawing showing a cross-sectional view of an exemplary resin-sealed electronic control device according to Fourth Embodiment of the present invention.

FIG. 14 is a schematic drawing showing a cross-sectional view of an exemplary resin-sealed electronic control device of Fourth Embodiment. In the resin-sealed electronic control device 400, the glass coating 9 is provided on the outermost side of the resin-sealed electronic control device.

Because the glass coating 9 is exposed on the outermost side, cracking of the glass coating 9 caused by an external impact needs to be prevented. To this end, the glass coating 9 has a thickness desirably above 100 μm. However, it is desired that the thickness is 1 mm or less in order to save the amount of the glass used.

In this configuration, the glass coating 9 covers a whole of the resin-sealed electronic control device 400, and there can be prevented infiltration of moisture and other matter into the resin-sealed electronic control device 400. This, combined with the advantages of First Embodiment, can improve the reliability of the resin-sealed electronic control device 400.

Figure 15:
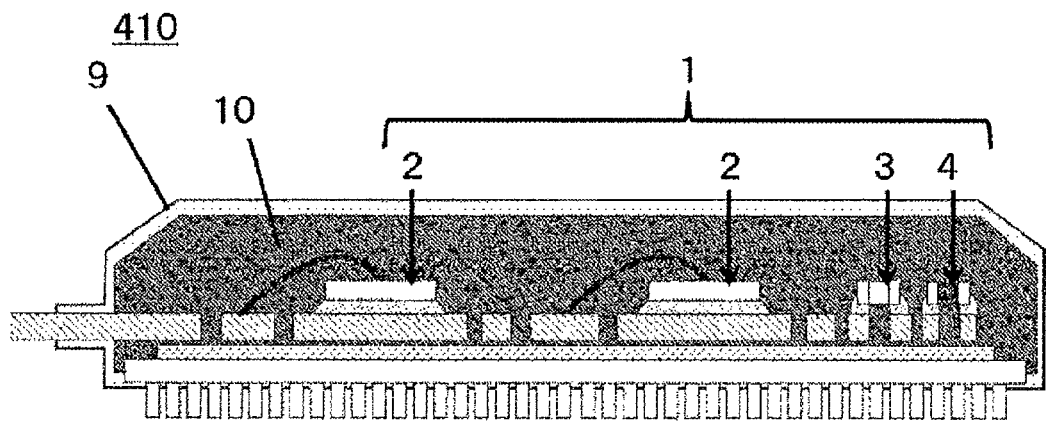
FIG. 15 is a schematic drawing showing a cross-sectional view of another example (variation 1) of the resin-sealed electronic control device of Fourth Embodiment of the present invention.

FIG. 15 is a schematic drawing showing a cross-sectional view of another example (variation 1) of the resin-sealed electronic control device of Fourth Embodiment. The resin-sealed electronic control device 410 of this variation of Fourth Embodiment differs from that of the variation 1 of First Embodiment (shown in FIG. 3) in a point that the glass coating 9 is provided on the outermost side.

With this configuration, the following advantages can be obtained, in addition to the advantages of the variation 1 of First Embodiment.

Because the glass coating 9 covers a whole of the resin-sealed electronic control device 410, there can be prevented infiltration of moisture and other matter into the resin-sealed electronic control device 410. This makes it possible to further improve the reliability of the resin-sealed electronic control device 410.

Figure 16:
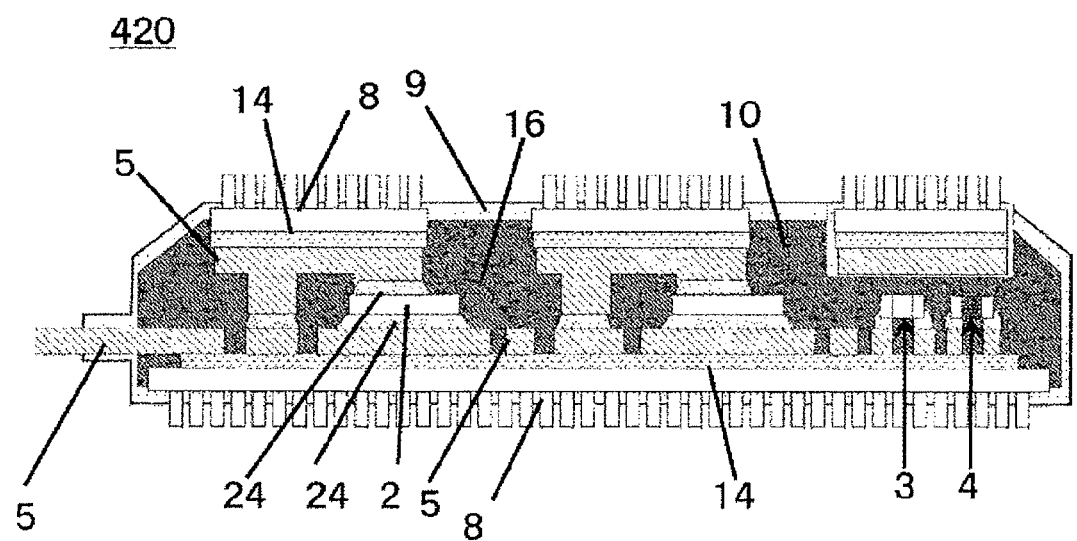
FIG. 16 is a schematic drawing showing a cross-sectional view of still another example (variation 2) of the resin-sealed electronic control device of Fourth Embodiment of the present invention.

FIG. 16 is a schematic drawing showing a cross-sectional view of still another example (variation 2) of the resin-sealed electronic control device of Fourth Embodiment. The resin-sealed electronic control device 420 of this variation of Fourth Embodiment differs from that of the variation 2 of First Embodiment (shown in FIG. 4) in a point that the glass coating 9 is provided on the outermost side.

With this configuration, the following advantages can be obtained, in addition to the advantages of the variation 2 of First Embodiment.

Because the glass coating 9 covers a whole of the resin-sealed electronic control device 420, and there can be prevented infiltration of moisture and other matter into the resin-sealed electronic control device 420. This makes it possible to further improve the reliability of the resin-sealed electronic control device 420.

Figure 17:
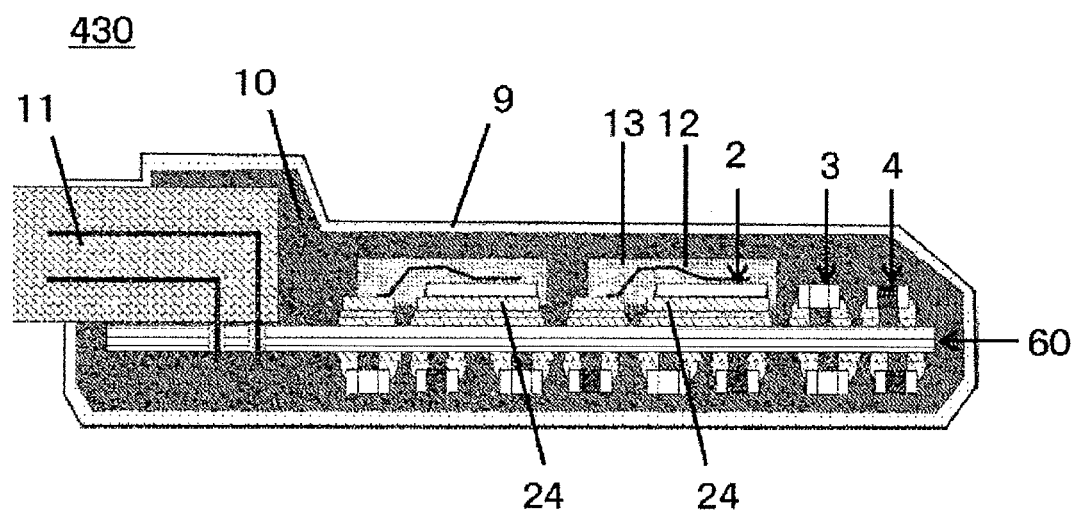
FIG. 17 is a schematic drawing showing a cross-sectional view of still another example (variation 3) of the resin-sealed electronic control device of Fourth Embodiment of the present invention.

FIG. 17 is a schematic drawing showing a cross-sectional view of still another example (variation 3) of the resin-sealed electronic control device of Fourth Embodiment. The resin-sealed electronic control device 430 of this variation of Fourth Embodiment differs from that of the variation 3 of First Embodiment (shown in FIG. 5) in a point that the glass coating 9 is provided on the outermost side.

With this configuration, the following advantages can be obtained, in addition to the advantages of the variation 3 of First Embodiment.

Because the glass coating 9 covers a whole of the resin-sealed electronic control device 430, and there can be prevented infiltration of moisture and other matter into the resin-sealed electronic control device 430. This makes it possible to further improve the reliability of the resin-sealed electronic control device 430.

Meanwhile, the resin-sealed electronic control devices (100, 200, 300, 400) of First to Fourth Embodiments can be used in water. When used in water, the water cools not only the heat radiating plate 8 but other portions of the device, and the cooling performance improves. Furthermore, because the element group 1 is surrounded by the glass coating 9, the element portions do not absorb water and the reliability improves.

Comparative Example

Figure 18:
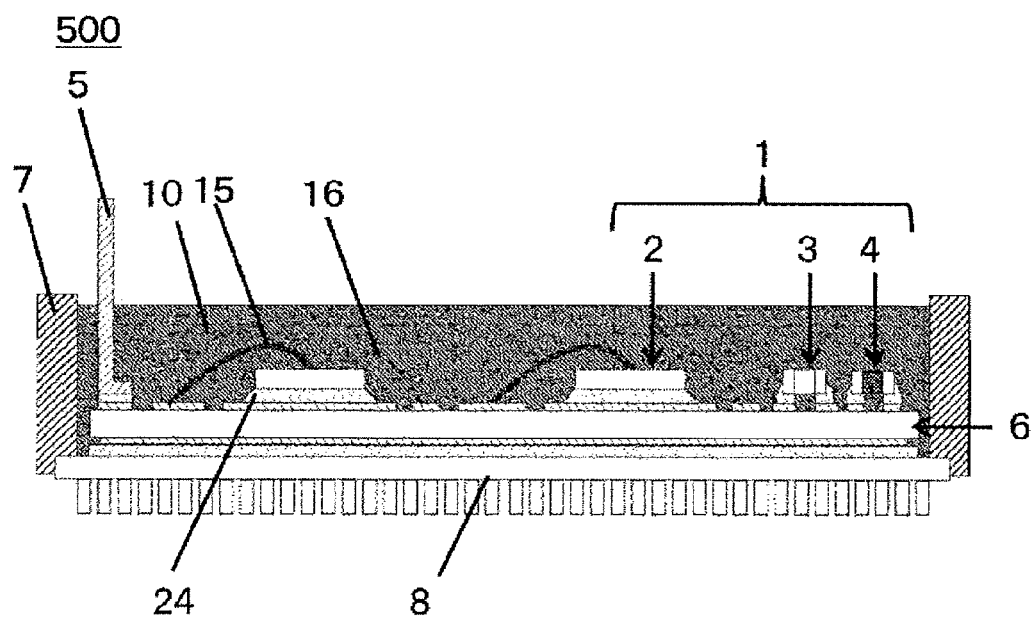
FIG. 18 is a schematic drawing showing a cross-sectional view of a resin-sealed electronic control device of Comparative Example.

FIG. 18 is a schematic drawing showing a cross-sectional view of a resin-sealed electronic control device of Comparative Example. The resin-sealed electronic control device 500 of Comparative Example differs from the devices of the present invention in a point that the glass coating is not provided.

When the resin-sealed electronic control device 500 of Comparative Example was used in water, the volume electrical resistivity of the sealing material became lower, and it was considered that the first sealing material 10 absorbed water. As a result, malfunctions of the device were caused by an increased leak current from the semiconductor element.

[Test Evaluation]
(Preparation of Glass)

Glass samples of various compositions presented in Table 1 were prepared. The compositions in the table are shown in a mass proportion of each component mixed in terms of an oxide. Oxide powders (purity 99.9%) available from Kojundo Chemical Laboratory Co., Ltd. were used as starting raw materials.

The starting raw material powders were mixed in the mass ratio presented in Table 1, and charged into a platinum crucible. The powders were mixed inside the crucible with a metallic spoon to avoid excess moisture absorption by the raw material powders.

The crucible with the mixed raw material powders was installed in a glass melting furnace and heated therein to form a molten glass. The temperature was increased to a set temperature (700 to 900° C.) at a rate of 10° C./min, and the molten glass was maintained at the temperature for 1 hour with stirring. The crucible was then removed from the glass melting furnace, and the molten glass was cast into a graphite mold being heated to 150° C. beforehand. The cast glass was moved into an annealing furnace being heated to an annealing temperature, maintained for 1 hour to relax strains, and cooled to a room temperature at a rate of 1° C./min. After being cooled to a room temperature, the annealed glass bulk was pulverized to obtain a glass powder having the composition presented in Table 1.

(Evaluation of Softening Point)

The glass powders were each measured for softening point Ts by differential thermal analysis (DTA). The reference material used was α-alumina. The mass of the reference material and each sample was 650 mg. The DTA measurements were conducted in an air atmosphere at a heating rate of 5° C./min. And, the softening point Ts of the glass composition sample was defined as the second endothermic peak temperature (see FIG. 19). The results are also presented in Table 1.

(Evaluation of Coefficient of Thermal Expansion)

Each glass powder was heated to a temperature at or above the softening point to prepare a test piece measuring 10 mm in height. And, the thermal expansion coefficient of the test piece was measured by using a thermomechanical analyzer (TMA). The measurements were conducted in an air atmosphere at a heating rate of 5° C./min. The coefficient of thermal expansion was calculated as a slope from data over the temperature range from a room temperature to 200° C. The results are also presented in Table 1.

TABLE 1

|  |  | Glass No. | | | | | |
|---|---|---|---|---|---|---|---|
|  |  | 1 | 2 | 3 | 4 | 5 | 6 |
| Glass mixture composition (mass %) | $V_2O_5$ | 30 | 30 | 25 | 30 | 25 | 30 |
|  | $Ag_2O$ | 30 | 30 | 30 | 25 | 30 | 30 |
|  | $Te_2O$ | 30 | 30 | 30 | 30 | 30 | 30 |
|  | $P_2O_5$ | 0 | 5 | 0 | 0 | 0 | 5 |
|  | $Ba(PO_3)_2$ | 10 | 0 | 10 | 10 | 10 | 0 |
|  | BaO | 0 | 0 | 0 | 0 | 0 | 0 |
|  | $WO_3$ | 0 | 5 | 5 | 5 | 0 | 0 |
|  | $Fe_2O_3$ | 0 | 0 | 0 | 0 | 0 | 5 |
|  | $Sb_2O_3$ | 0 | 0 | 0 | 0 | 5 | 0 |
| Transition temperature (° C.) | Tg | 222 | 230 | 223 | 236 | 244 | 235 |
|  | Td | 246 | 246 | 245 | 262 | 278 | 262 |
|  | Ts | 277 | 284 | 285 | 295 | 321 | 300 |
|  | Tc | 327 | 322 | None | 336 | 375 | 347 |
| Coefficient of thermal expansion (ppm/° C.) |  | 17.1 | 16 | 17.2 | 15.8 | 15.1 | 15 |
| Volume electrical resistivity (Ωm) at 100 V |  | $2.2 \times 10^{12}$ | $1.6 \times 10^{13}$ | $8.2 \times 10^{11}$ | $2.0 \times 10^{11}$ | $3.5 \times 10^{11}$ | $2.5 \times 10^{12}$ |

|  |  | Glass No. | | | | | |
|---|---|---|---|---|---|---|---|
|  |  | 7 | 8 | 9 | 10 | 11 | 12 |
| Glass mixture composition (mass %) | $V_2O_5$ | 25 | 25 | 25 | 30 | 17 | 17 |
|  | $Ag_2O$ | 30 | 30 | 30 | 25 | 38 | 43 |
|  | $Te_2O$ | 30 | 30 | 30 | 30 | 30 | 30 |
|  | $P_2O_5$ | 10 | 5 | 5 | 0 | 0 | 0 |
|  | $Ba(PO_3)_2$ | 0 | 0 | 0 | 10 | 10 | 0 |
|  | BaO | 0 | 0 | 0 | 0 | 0 | 5 |
|  | $WO_3$ | 0 | 5 | 10 | 5 | 5 | 5 |
|  | $Fe_2O_3$ | 5 | 5 | 0 | 0 | 0 | 0 |
|  | $Sb_2O_3$ | 0 | 0 | 0 | 0 | 0 | 0 |
| Transition temperature (° C.) | Tg | 266 | 249 | 236 | 237 | 197 | 177 |
|  | Td | 291 | 272 | 253 | 257 | 214 | 192 |
|  | Ts | 332 | 315 | 294 | 296 | 260 | 233 |
|  | Tc | None | None | None | 364 | None | 400 |
| Coefficient of thermal expansion (ppm/° C.) |  | 14.4 | 14.6 | 15.9 | 15.8 | 19.3 | 24.8 |
| Volume electrical resistivity (Ωm) at 100 V |  | $1.5 \times 10^{12}$ | $1.2 \times 10^{10}$ | $5.9 \times 10^{10}$ | $8.1 \times 10^{11}$ | $1.9 \times 10^{10}$ | $5.6 \times 10^{9}$ |

The resin-sealed electronic control device of the present invention may be implemented by appropriately combining the embodiments described above.

The resin-sealed electronic control device of the present invention may be applied in many variations within the gist of the present invention. In brief, a resin-sealed electronic control device of the invention is structured as to include the glass coating that surrounds a plurality of elements and a substrate, and is formed on the outer side or inside of the sealing material.

Practice of the embodiments of the present invention exhibits the following advantages.

The coating of a molten vanadium-based glass is directly formed on the element group 1, the bonding members (15, 16, 24), and the substrate 6. This improves the adhesion for the constitution materials of the resin-sealed electronic control device, such as the semiconductor, the metal, the ceramic, and the resin. Thereby, the device can improve reliability.

The improved adhesion is provided by a diffusion layer formed by contact of the softened low-viscosity vanadium-based glass with a metal surface. Alternatively, when the vanadium-based glass softens, the hydroxyl groups arising from glass lattice defects concentrate at the surface or interface. Thereby, there is improved the adhesion of the glass to ceramics such as oxides and semiconductors, and resins.

Furthermore, the glass softening point can be lowered to 300° C. or less by adding tellurium or silver to the vanadium-based glass. This reduces the thermal stress due to the thermal expansion difference between the glass coating and the constitution materials of the resin-sealed electronic control device, and can prevent cracking in the glass coating.

Moreover, the thermal expansion coefficient of the glass can be controlled by adjusting the tellurium and silver contents in the vanadium-based glass. And, reliability against temperature changes can be improved by adjusting the thermal expansion coefficient of the glass close to those of the copper, aluminum, sealing material, and other constitution materials of the resin-sealed electronic control device.

LEGEND

1: Element group;
2: Semiconductor chip;
3: Chip capacitor;
4: Chip resistor;
5: Bonding member;
6: Substrate;
7: Case;
8: Heat radiating plate;
9: Glass coating;
10: First sealing material;
11: Connector;
12: Insulating resin coating;
13: Second sealing material;
14: High-heat-conductivity resin;
15: Aluminum ribbon;

16: Aluminum wire;
17: Chip aluminum electrode;
18: Chip nickel plated electrode;
19: Polyimide passivation film;
20: Substrate copper wiring;
21: Nickel plated wiring;
22: Substrate insulator;
23: Insulator; and
24: Die bonding material.

The invention claimed is:

1. An electronic control device comprising:
a plurality of semiconductor elements;
a substrate with the plurality of semiconductor elements mounted thereon; and
a resin sealing the substrate and the plurality of semiconductor elements,
wherein the semiconductor elements and the substrate are partially covered with a glass coating containing vanadium and tellurium, and
wherein the glass coating contains $Ag_2O$, $V_2O_5$, and $TeO_2$ in a total content of 75 mass % or more with respect to the total mass of the glass coating.

2. The electronic control device according to claim 1, wherein the glass coating and the semiconductor elements are connected to each other via the resin sealing, and
wherein the glass coating and the substrate are connected to each other via the resin sealing.

3. The electronic control device according to claim 2, wherein the resin sealing directly contacts an outermost surface of the glass coating.

4. The electronic control device according to claim 3, wherein the glass coating contains $TeO_2$ of 15 mass % or more with respect to the total mass of the glass coating.

5. The electronic control device according to claim 3, wherein the $V_2O_5$ is contained in 15 mass % to 40 mass % with respect to the total mass of the glass coating.

6. The electronic control device according to claim 3, wherein the $Ag_2O$ and the $TeO_2$ are contained in a total content of 25 mass % or more with respect to the total mass of the glass coating.

7. The electronic control device according to claim 3, wherein the $Ag2_O$ is contained in at most 2.6 times the $V_2O_5$ content.

8. The electronic control device according to claim 2, wherein the glass coating contains $TeO_2$ of 15 mass % or more with respect to the total mass of the glass coating.

9. The electronic control device according to claim 2, wherein the $V_2O_5$ is contained in 15 mass % to 40 mass % with respect to the total mass of the glass coating.

10. The electronic control device according to claim 2, wherein the $Ag_2O$ and the $TeO_2$ are contained in a total content of 25 mass % or more with respect to the total mass of the glass coating.

11. The electronic control device according to claim 2, wherein the $Ag2_O$ is contained in at most 2.6 times the $V_2O_5$ content.

12. The electronic control device according to claim 1, wherein the glass coating directly contacts the semiconductor elements and the substrate.

13. The electronic control device according to claim 12, wherein the glass coating contains $TeO_2$ of 15 mass % or more with respect to the total mass of the glass coating.

14. The electronic control device according to claim 12, wherein the $V_2O_5$ is contained in 15 mass % to 40 mass % with respect to the total mass of the glass coating.

15. The electronic control device according to claim 12, wherein the $Ag_2O$ and the $TeO_2$ are contained in a total content of 25 mass % or more with respect to the total mass of the glass coating.

16. The electronic control device according to claim 12, wherein the $Ag2_O$ is contained in at most 2.6 times the $V_2O_5$ content.

17. The electronic control device according to claim 1, wherein the glass coating contains $TeO_2$ of 15 mass % or more with respect to the total mass of the glass coating.

18. The electronic control device according to claim 1, wherein the $V_2O_5$ is contained in 15 mass % to 40 mass % with respect to the total mass of the glass coating.

19. The electronic control device according to claim 1, wherein the $Ag_2O$ and the $TeO_2$ are contained in a total content of 25 mass % or more with respect to the total mass of the glass coating.

20. The electronic control device according to claim 1, wherein the $Ag_2O$ is contained in at most 2.6 times the $V_2O_5$ content.

* * * * *